United States Patent
Collins, III

(10) Patent No.: US 7,087,465 B2
(45) Date of Patent: Aug. 8, 2006

(54) METHOD OF PACKAGING A SEMICONDUCTOR LIGHT EMITTING DEVICE

(75) Inventor: William D. Collins, III, San Jose, CA (US)

(73) Assignee: Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 10/737,433

(22) Filed: Dec. 15, 2003

(65) Prior Publication Data

US 2005/0130336 A1     Jun. 16, 2005

(51) Int. Cl.
*H01L 21/44* (2006.01)
*H01L 21/48* (2006.01)
*H01L 21/50* (2006.01)

(52) U.S. Cl. .................. 438/115; 438/117; 438/124; 438/126; 438/127

(58) Field of Classification Search ............. 438/115, 438/117, 124, 126, 127
See application file for complete search history.

(56) References Cited

U.S. PATENT DOCUMENTS

| | | | | |
|---|---|---|---|---|
| 4,425,015 A | * | 1/1984 | Rizzo | 439/83 |
| 5,477,611 A | * | 12/1995 | Sweis et al. | 29/840 |
| 5,663,106 A | * | 9/1997 | Karavakis et al. | 29/841 |
| 5,801,441 A | * | 9/1998 | DiStefano et al. | 257/696 |
| 5,922,252 A | * | 7/1999 | Stanton et al. | 264/4 |
| 5,981,312 A | * | 11/1999 | Farquhar et al. | 438/112 |
| 5,998,242 A | * | 12/1999 | Kirkpatrick et al. | 438/127 |
| 6,080,605 A | * | 6/2000 | Distefano et al. | 438/126 |
| 6,187,613 B1 | * | 2/2001 | Wu et al. | 438/108 |
| 6,218,215 B1 | * | 4/2001 | Distefano et al. | 438/108 |
| 6,329,224 B1 | * | 12/2001 | Nguyen et al. | 438/127 |
| 6,458,628 B1 | * | 10/2002 | Distefano et al. | 438/126 |
| 6,492,251 B1 | * | 12/2002 | Haba et al. | 438/612 |
| 6,541,874 B1 | * | 4/2003 | Nguyen et al. | 257/787 |
| 6,543,131 B1 | * | 4/2003 | Beroz et al. | 29/854 |
| 6,552,263 B1 | * | 4/2003 | Farquhar et al. | 174/52.2 |
| 6,602,740 B1 | * | 8/2003 | Mitchell | 438/127 |
| 6,608,391 B1 | * | 8/2003 | Wu | 257/787 |
| 6,651,321 B1 | * | 11/2003 | Beroz et al. | 29/840 |
| 6,750,539 B1 | * | 6/2004 | Haba et al. | 257/737 |
| 2002/0125486 A1 | * | 9/2002 | Kondo et al. | 257/79 |
| 2004/0035519 A1 | * | 2/2004 | Beroz et al. | 156/85 |

FOREIGN PATENT DOCUMENTS

JP      05308185 A   *  11/1993

* cited by examiner

*Primary Examiner*—David E. Graybill
(74) *Attorney, Agent, or Firm*—Patent Law Group LLP; Rachel V. Leiterman

(57) ABSTRACT

A semiconductor light emitting device is packaged by forming a sealed compartment enclosing the device, at least one of the walls of the sealed compartment being formed of an elastomeric material. The elastomeric material is then penetrated with a needle and a quantity of softer material is injected through the needle into the sealed compartment. In some embodiments, a coaxial needle or two needles are used, one needle to inject the softer material and one needle to vent air from the compartment.

23 Claims, 2 Drawing Sheets

METHOD OF PACKAGING A SEMICONDUCTOR LIGHT EMITTING DEVICE

BACKGROUND

1. Field of Invention

The present invention relates to a method of packaging a semiconductor light emitting device.

2. Description of Related Art

Semiconductor light emitting devices such as light emitting diodes (LEDs) are among the most efficient light sources currently available. Material systems currently of interest in the manufacture of high brightness LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, and phosphorus, also referred to as III-phosphide materials. Often III-nitride devices are epitaxially grown on sapphire, silicon carbide, or III-nitride substrates and III-phosphide devices are epitaxially grown on gallium arsenide by metal organic chemical vapor deposition (MOCVD) molecular beam epitaxy (MBE) or other epitaxial techniques. The devices include an active, light emitting region sandwiched between an n-type region and a p-type region. Electrical contacts are provided on the n- and p-type regions.

FIG. 1 illustrates a package for an LED, described in more detail in U.S. Pat. Nos. 6,204,523 and 6,274,924. LED die 2 is enclosed in a package which generally includes a bed arrangement 3 upon which the LED die 2 rests, and an optically transmissive cover, generally including a lens. The bed arrangement 3 supports the LED die 2. The bed arrangement 3 includes a lower housing member 4 which has a die placement area 6. The die placement area 6 may be substantially flat, or may be configured as a receptacle. A reflective surface 8 may be provided on the die placement area 6, to direct emitted light outward. A substrate member 10 may be positioned inside the die placement area 6, to support the die 2 itself. The bed arrangement 3 also includes a lead support member 12, which is positioned over the lower housing member 4. Heavy leads 14, provided on the exterior of the package for incorporating the package into circuits and systems, are coupled through the lead support member 12 to fine leads (not shown), which couple directly to the LED die 2. The lead support member 12 includes an aperture 16, through which light emitted by the die 2 passes. An optically transmissive cover 18 is positioned over the bed arrangement 3, to cover and protect the LED die 2 and its leads.

The cover 18 is made of one or more materials which are chosen for light-transmissive properties and for stability over the environmental conditions under which the LED is to operate. Conventionally, the optically transmissive cover 18 has been made of hard optical materials such as PMMA, glass, polycarbonate, optical nylon, transfer molded epoxy, cyclic olefin copolymer, rigid silicone, other optical plastics, glasses, ceramics, or other transparent materials such as aluminum oxide. The design of FIG. 1 necessarily forms a cavity between cover 18 and LED die 2. The cavity generally contains air. This air-filled cavity creates one or more abrupt change in refractive index at the refractive index interfaces in the optical path; for example, at the interface between die 2 and the air in the cavity. These index steps tend to trap, deflect or refract, and scatter the light, reducing the percentage of the light generated within the LED chip that is extracted from the package.

SUMMARY

In accordance with the invention, a semiconductor light emitting device is packaged by forming a sealed compartment enclosing the device, at least one of the walls of the sealed compartment being formed of an elastomeric material. The elastomeric material is then penetrated with a needle and a quantity of softer material is injected through the needle into the sealed compartment. In some embodiments, a coaxial needle or two needles are used, one needle to inject the softer material and one needle to vent air from the compartment.

The use of an elastomeric cover and needle penetration to fill the compartment formed by the cover may offer several advantages, including a more durable package, a better seal between the components that form the compartment, simplified manufacture of the individual parts that form the compartment, and simplified assembly of the parts that form the compartment.

DETAILED DESCRIPTION

Figure 1:
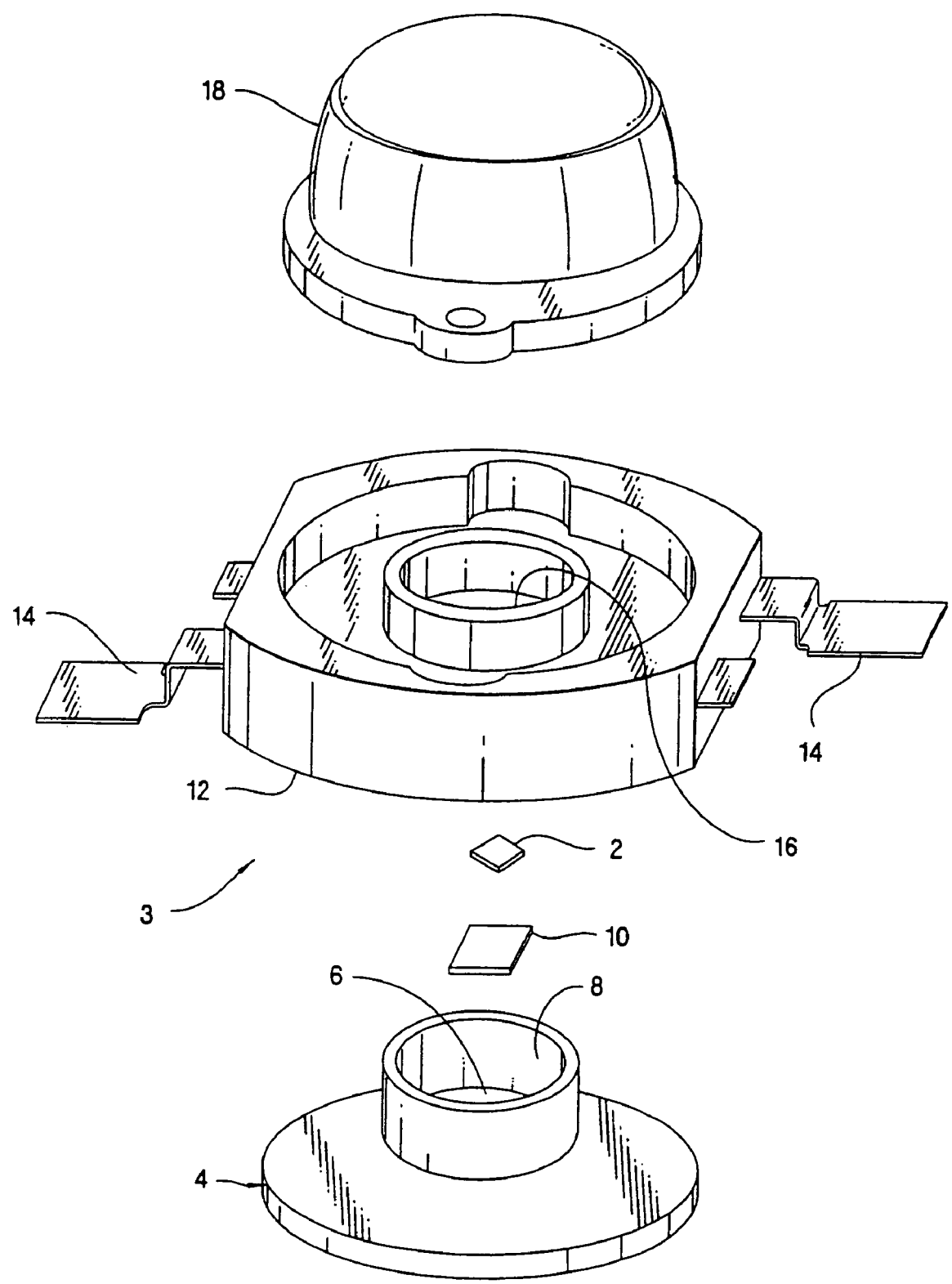
FIG. 1 illustrates a prior art package for a semiconductor light emitting device.

Light extraction from the package of FIG. 1 may be improved by filling the cavity continuously within the optical path with a material that is index matched to die 2 and/or cover 18. The index matching material seals and protects the important surfaces of the semiconductor and optical cavity from environmental attack that may jeopardize the electrical operation of the semiconductor or efficient optical transmission through the optical path.

The device of FIG. 1 has a rigid shell, thus in order to fill the cavity in high volume manufacture, the optical cavity of a device must be provided with a fill and vent channel that must later be sealed by some additional manufacturing process to retain and protect the material, such as by curing the injected encapsulant in place, by inserting a mechanical plug, by applying a compatible adhesive sealant, or by reforming package materials by processes such as ultrasonic welding or heat-welding. Such filling and sealing procedures may compromise part robustness, complicate fabrication of the individual parts in the package, complicate package assembly by requiring precise rotational control of the individual components, reduce yields due to the difficulty of forming a truly sealed cavity in this manner, decrease assembly throughput through more complicated mechanization than might otherwise be required, and force tight fill controls to avoid the requirement of costly post injection part clean-up processes, as compared to a design where discrete fill channels were not required.

In an embodiment of the invention, cover 18 of the semiconductor light emitting device package of FIG. 1 includes a section of soft, elastomeric material, rather than a rigid material. In some embodiments, the entire cover is soft and elastomeric. For example, the elastomeric cover may be a high durometer material, between about ShoreA 20 and about ShoreA 80. Materials softer than ShoreA 20 may not be rigid enough to form a lens, while material harder than ShoreA 80 may not be soft enough to penetrate with a needle, as described below. An example of a suitable elastomeric cover is a high durometer silicon rubber or similar material. In some embodiments, a rigid lens includes a soft, elastomeric section. In such embodiments, the elastomeric section may be softer than ShoreA 20. The cover material may be selected to be durable and to tolerate light of the wavelength emitted by the light emitting device without degrading, for example, by yellowing.

The cavity between cover 18 and frame 12 is filled with a softer material, generally silicone. The softer material may be a solid, such as a gel, or a liquid. In some embodiments, the softer material is optically transparent and non-scattering. In some embodiments, the softer material may contain a dissolved or suspended material such as an optical dye, phosphor, or other wavelength converting material, or a suspension of materials such as nano-particles or polymers with a different refractive index than the bulk softer material.

The indices of refraction of the cover and the softer material in the cavity may be selected to minimize Bragg reflection losses and waveguiding at the interfaces between the device and the softer material, and the softer material and the cover. For example, the softer material in the cavity may have an index of refraction equal to or between the indices of refraction of the cover and the light emitting device. The cover may have an index of refraction equal to or between the indices of refraction of the softer material in the cavity and the material outside the cover, typically air. For example, if the light emitting device is a III-nitride flip chip device grown on a sapphire substrate, light is extracted from the device through the sapphire substrate, which has an index of refraction of about 1.8. Assuming the packaged device is to be operated surrounded by air, which has an index of refraction of about 1, the softer material in the cavity may have an index of refraction ranging between about 1.8 and the index of refraction of the cover, which is usually less than the index of refraction of the extraction surface of the device, about 1.8 in this example. The cover may have an index of refraction ranging between the index of refraction of the softer material and about 1.

Figure 2:
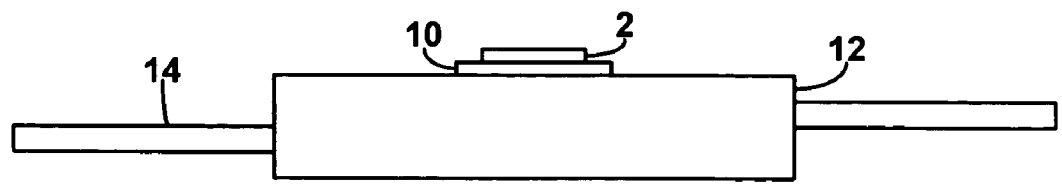
FIGS. 2–4 illustrate a method of packaging a semiconductor light emitting device, according to embodiments of the invention.
Figure 3:
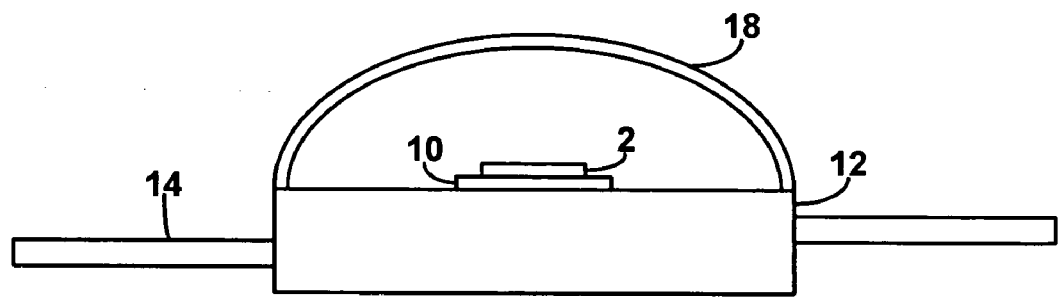
Figure 4:
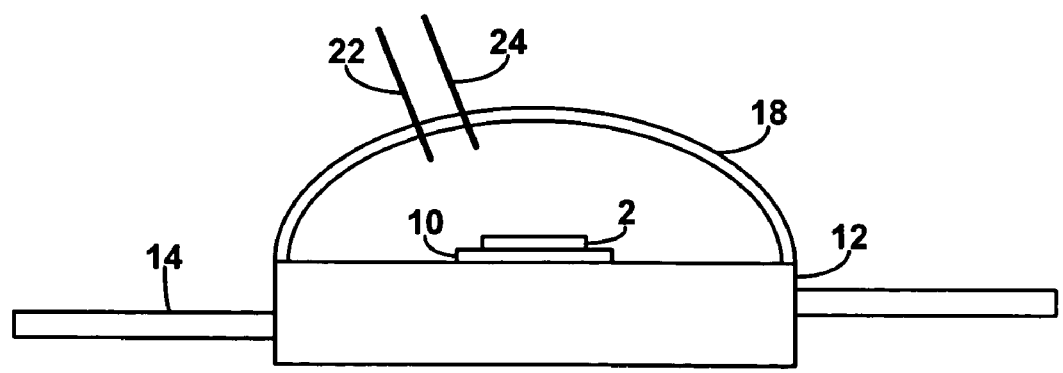

The cavity may be filled by puncturing the elastomeric cover with a needle, then injecting the softer cavity-filling material through the needle, as illustrated in FIGS. 2–4. In FIG. 2, a light emitting device 2 is mounted on an optional mount 10, then connected to a lead frame 12 and electrically connected to leads 16. A cover 18 including an elastomeric section is sealed over lead frame 12 in FIG. 3, forming a sealed cavity filled with air. Cover 18 may be attached to lead frame 12 by, for example, an adhesive. In FIG. 4, two needles 22 and 24 puncture the elastomeric section of cover 18, one needle for injecting the cavity filling material and one needle for venting the air in the cavity. In some embodiments, rather than two needles, a single, coaxial needle is used. In some embodiments, cover 18 may be sealed over lead frame 12 in a vacuum, such that nothing fills the cavity between cover 18 and lead frame 12, eliminating the need for a venting needle. A second venting needle may also be avoided by using a serrated needle to inject the material, such that the serrations provide a path for air to escape during injection, or by deflecting the injecting needle laterally after penetration to stretch the needle hole enough to provide a path for air to escape on the low pressure side of the stretched needle hole.

The material injected in the cavity may be the softer material itself, or a precursor that is later reacted to form the softer material. For example, unreacted or partially reacted liquid silicone may be injected in the cavity, then exposed to heat, ultraviolet light, or a catalyst to trigger cross-linking. A catalyst, if required to react the precursor, may be injected after the precursor or coated on the inside of cover 18. If the cavity is adequately sealed, the softer material in the cavity may be a liquid.

After the cavity filling material is injected, the needles are removed. Elastomeric cover 18 reseals the punctures created by needles 22 and 24 as soon as the needles are removed. In some embodiments, the injected material or another stimulus seals the punctures, such as by cross-linking the walls of the puncture together in an embodiment where the cover is a partially cured elastomeric cover at the time of needle penetration, by cross-linking a precursor material injected in the cavity and dragged onto the seal surfaces by needle removal, or by interaction of a soft injected material with a firm outer elastomeric shell material.

Needle injection of the cavity filling material into a device with an elastomeric cover may alleviates some of the problems with filling and sealing the cavity in a rigid-cover device, as described above. Since a port in cover 18 is not required, cover 18 may be symmetrical, eliminating the need the align a port in cover 18 with a particular position on lead frame 12, reducing the complexity of the fabrication of cover 18, and permitting the formation of a seal at all points between cover 18 and lead frame 12. The ability to form a seal at all points between cover 18 and lead frame 12 may result in a more robust package, since more space is available to seal cover 18 to lead frame 12, leading to a better seal. In addition, eliminating a port in cover 18 or lead frame 12 may increase the durability of these parts of the package. Further, in some embodiments, the cover, adhesive attaching the cover to the lead frame, and soft filler material may all be silicone, providing chemical compatibility between the cover, adhesive, and soft filler material.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A method of packaging a semiconductor light emitting device, the method comprising:
    forming a sealed compartment enclosing a semiconductor light emitting device, the sealed compartment comprising a frame and a cover disposed over the frame, the cover comprising a top section connected to a sidewall section, the top section and sidewall section being formed of a first material comprising an elastomeric material;
    penetrating the elastomeric material with a needle; and
    injecting a quantity of a second material through the needle into the compartment.

2. The method of claim 1 wherein the first material comprises a material having a hardness of at least ShoreA 20.

3. The method of claim 1 wherein the first material has a hardness between about ShoreA 20 and about ShoreA 80.

4. The method of claim 1 wherein the first material comprises silicone.

5. The method of claim 1 wherein the second material is solid material that is softer than the first material.

6. The method of claim 1 wherein the second material is a gel.

7. The method of claim 1 wherein the second material comprises silicone.

8. The method of claim 1 wherein the second material is a liquid.

9. The method of claim 1 further comprising reacting the second material to form an elastomer.

10. The method of claim 9 wherein reacting the second material comprises exposing the second material to light, exposing the second material to heat, or exposing the second material to a catalyst.

11. The method of claim 1 further comprising venting air from the compartment.

12. The method of claim 1 wherein the needle comprises a coaxial needle having a first chamber and a second chamber, the method further comprising:
    injecting the second material through the first chamber; and
    venting air from the compartment through the second chamber.

13. The method of claim 1 wherein the needle is a first needle, the method further comprising:
    penetrating the elastomeric material with a second needle;
    injecting the second material through the first needle; and
    venting air from the compartment through the second needle.

14. The method of claim 1 further comprising selecting the elastomeric material such that the elastomeric material seals a hole left by the needle once the needle is removed from the elastomeric material.

15. The method of claim 1 wherein forming a sealed compartment further comprises:
    mounting the semiconductor light emitting device on a lead frame;
    electrically connecting the semiconductor light emitting device to leads on the lead frame; and
    sealing a lens formed from the elastomeric material over the lead frame.

16. The method of claim 1 wherein the second material completely fills the sealed compartment.

17. The method of claim 1 wherein:
    the semiconductor light emitting device comprises a surface through which light is extracted;
    an index of refraction of the second material is less than or equal to an index of refraction of the surface; and
    an index of refraction of the first material is less than or equal to the index of refraction of the second material.

18. The method of claim 17 wherein the index of refraction of the first material is greater than an index of refraction of air.

19. The method of claim 1 wherein the needle pierces the elastomeric material.

20. The method of claim 1 wherein the sealed compartment is formed prior to penetrating the elastomeric material with a needle.

21. The method of claim 1 wherein the top section is substantially perpendicular to the sidewall section.

22. The method of claim 1 wherein the cover has a dome shape.

23. The method of claim 1 wherein the top section and the sidewall section are integrated in a single piece of material of substantially uniform composition.

* * * * *

UNITED STATES PATENT AND TRADEMARK OFFICE
CERTIFICATE OF CORRECTION

| | | |
|---|---|---|
| PATENT NO. | : 7,087,465 B2 | Page 1 of 1 |
| APPLICATION NO. | : 10/737433 | |
| DATED | : August 8, 2006 | |
| INVENTOR(S) | : William D. Collins, III | |

It is certified that error appears in the above-identified patent and that said Letters Patent is hereby corrected as shown below:

Column 6, line 3: Cancel "scaling" and substitute --sealing--.

Signed and Sealed this

Twenty-seventh Day of March, 2007

JON W. DUDAS
*Director of the United States Patent and Trademark Office*